(12) United States Patent
Simbeck et al.

(10) Patent No.: US 12,237,595 B2
(45) Date of Patent: Feb. 25, 2025

(54) INTERCONNECT SYSTEM FOR HIGH CURRENT CONDUCTOR TO CIRCUIT BOARD

(71) Applicant: Raytheon Company, Waltham, MA (US)

(72) Inventors: Sara Lorene Simbeck, Marlborough, MA (US); Glenn Arthur Gage, Marlborough, MA (US); Roy Emerson Martin, III, Marlborough, MA (US)

(73) Assignee: Raytheon Company, Arlington, VA (US)

( * ) Notice: Subject to any disclaimer, the term of this patent is extended or adjusted under 35 U.S.C. 154(b) by 441 days.

(21) Appl. No.: 17/719,755

(22) Filed: Apr. 13, 2022

(65) Prior Publication Data

US 2023/0335927 A1    Oct. 19, 2023

(51) Int. Cl.
| | |
|---|---|
| *H01R 12/57* | (2011.01) |
| *H01R 43/02* | (2006.01) |
| *H05K 1/18* | (2006.01) |
| *H01R 4/02* | (2006.01) |
| *H01R 4/18* | (2006.01) |

(52) U.S. Cl.
CPC ......... *H01R 12/57* (2013.01); *H01R 43/0256* (2013.01); *H05K 1/181* (2013.01); *H01R 4/023* (2013.01); *H01R 4/182* (2013.01); *H01R 4/187* (2013.01); *H05K 2201/09072* (2013.01); *H05K 2201/1031* (2013.01)

(58) Field of Classification Search
CPC .... H01R 12/57; H01R 43/0256; H01R 4/023; H01R 4/182; H01R 4/187; H05K 1/181; H05K 2201/09072; H05K 2201/1031
USPC .......................................................... 439/783
See application file for complete search history.

(56) References Cited

U.S. PATENT DOCUMENTS

| | | | |
|---|---|---|---|
| 4,374,603 A | 2/1983 | Fukunaga et al. | |
| 6,116,954 A | 9/2000 | Ries | |
| 6,722,894 B2 | 4/2004 | Burmeister | |
| 6,830,459 B2 | 12/2004 | West | |
| 7,663,466 B1 * | 2/2010 | Jetton | H01R 11/287 |
| | | | 361/833 |
| 10,276,963 B2 | 8/2019 | Powell | |

(Continued)

FOREIGN PATENT DOCUMENTS

| | | | | |
|---|---|---|---|---|
| AU | 2011215338 A1 * | 8/2012 | .......... | H01H 85/044 |
| CN | 204558681 U * | 8/2015 | | |

(Continued)

OTHER PUBLICATIONS

International Search Report and Written Opinion for related International Application No. PCT/US2023/061129, mailed Jun. 20, 2023.

*Primary Examiner* — Peter G Leigh

(57) ABSTRACT

An electrical interconnect including slotted lug with a receiving end for connecting to a flat electrical conductor and a fastening end for connecting to a surface mount terminal extending from the surface of a circuit, such as an integrated metal substrate (IMS) circuit board or a circuit card assembly. The interconnect provides a secure connection capable of transmitting a current of at least 100 Arms, to give a non-limiting example value. The interconnect further provides low contact resistance and ease of manufacturing.

20 Claims, 7 Drawing Sheets

(56) References Cited

U.S. PATENT DOCUMENTS

| | | | | |
|---|---|---|---|---|
| 2008/0265004 A1* | 10/2008 | Stroh | ................ | H01R 43/0207 |
| | | | | 228/110.1 |
| 2009/0108982 A1* | 4/2009 | Ohashi | ................ | H01H 85/044 |
| | | | | 337/191 |
| 2013/0337697 A1* | 12/2013 | Buschel | ................ | H05K 1/141 |
| | | | | 439/660 |
| 2018/0096814 A1* | 4/2018 | Onoda | ................... | H01H 85/20 |
| 2021/0257176 A1* | 8/2021 | Urrea | ................ | H01H 85/0241 |

FOREIGN PATENT DOCUMENTS

| | | | | | |
|---|---|---|---|---|---|
| CN | 208192894 U | * | 12/2018 | | |
| CN | 208909839 U | * | 5/2019 | | |
| CN | 211155094 U | * | 8/2020 | | |
| CN | 214548853 U | * | 11/2021 | | |
| WO | WO-2021163250 A1 | * | 8/2021 | ........... | H01H 85/044 |

\* cited by examiner

View B - B

View A - A

View B - B

INTERCONNECT SYSTEM FOR HIGH CURRENT CONDUCTOR TO CIRCUIT BOARD

FIELD OF THE INVENTION

The present disclosure relates generally to electrical connections between high current conductors and integrated metal substrate circuits.

BACKGROUND

Electrical interconnects provide an electrical connection between components in electrical systems. Such interconnects provide both the electrical and mechanical connections between the components.

SUMMARY OF THE INVENTION

Electrical resistance in the interconnects negatively affect system performance in terms of power loss and voltage drop. Hot spots due to resistance in the interconnect may also damage the system and become a fire hazard. These issues are particularly problematic in high current power systems, i.e., those operating at 100 Arms or more. Current electrical interconnect options fail to provide sufficiently low resistance to address these problems, are not rated for high current power systems, and/or are not compatible with integrated metal substrate circuit boards. Thus there is a need to provide an electrical interconnect that both minimizes the electrical resistance between connected components and is capable of conducting 100 Arms or more.

According to an aspect of the disclosure, an electrical interconnect system includes a slotted lug, including: a receiving end; and a fastening end; wherein the fastening end comprises: a plurality of tabs, each of the plurality of tabs separated from an adjacent tab by a slot extending through a depth of the fastening end; and each of the plurality of tabs including a through hole extending in a depth direction; and wherein an angle formed between the receiving end and the fastening end is between −100° to 100°.

According to an embodiment of any paragraph(s) of this summary, the receiving end is configured to connect to a flat electrical conductor.

According to an embodiment of any paragraph(s) of this summary, the flat electrical conductor is selected from a flat wire, a foil, and a rectangular Litz wire.

According to an embodiment of any paragraph(s) of this summary, the receiving end is crimped onto the flat electrical conductor.

According to an embodiment of any paragraph(s) of this summary, a connection between the receiving end and the flat electrical conductor is selected from at least one of crimping and soldering.

According to an embodiment of any paragraph(s) of this summary, the receiving end further includes wings that are folded inward from a back so that the flat electrical conductor can be inserted therebetween.

According to an embodiment of any paragraph(s) of this summary, the angle formed between the receiving end and the fastening end is −100° to 100°.

According to an aspect of the disclosure, the inventive electrical interconnect system further includes a circuit and a surface mount terminal extending from a surface of the circuit.

According to an aspect of the disclosure, the circuit may be selected from an integrated metal substrate (IMS) circuit board and a circuit card assembly (CCA).

According to an embodiment of any paragraph(s) of this summary, the surface mount terminal includes a plurality of tapped holes such that each tapped hole corresponds to a through hole on the tabs.

According to an embodiment of any paragraph(s) of this summary, each tab is secured to the surface mount terminal with a fastener that passes through the through hole and into the corresponding tapped hole.

According to an embodiment of any paragraph(s) of this summary, the surface mount terminal further comprises two or more alignment posts protruding from a surface that contacts the circuit and the circuit further comprises receptacles configured to receive the alignment posts.

According to an embodiment of any paragraph(s) of this summary, the surface mount terminal is soldered to the circuit.

According to an aspect of the disclosure, a method of making an electrical connection includes: inserting a flat electrical conductor into a receiving end of a slotted lug; securing the flat electrical conductor to the receiving end; placing a surface mount terminal onto a circuit such that alignment posts extending from a surface of the surface mount terminal are inserted into receptacles on the circuit; securing the surface mount terminal to the circuit; and connecting a fastening end of the slotted lug to the surface mount terminal extending.

According to an embodiment of any paragraph(s) of this summary, the step of securing the flat electrical conductor is selected from at least one of crimping and soldering.

According to an embodiment of any paragraph(s) of this summary, the surface mount terminal is soldered to the circuit.

According to an embodiment of any paragraph(s) of this summary, the flat electrical conductor is connected to the receiving end of the slotted lug by at least one of crimping and soldering.

According to an embodiment of any paragraph(s) of this summary, slotted lug and surface mount terminal are attached to each other with fasteners.

While a number of features are described herein with respect to embodiments of the disclosure; features described with respect to a given embodiment also may be employed in connection with other embodiments. The following description and the annexed drawings set forth certain illustrative embodiments of the disclosure. These embodiments are indicative, however, of but a few of the various ways in which the principles of the disclosure may be employed. Other objects, advantages, and novel features according to aspects of the disclosure will become apparent from the following detailed description when considered in conjunction with the drawings.

BRIEF DESCRIPTION OF THE DRAWINGS

The annexed drawings, which are not necessarily to scale, show various aspects of the disclosure.

DETAILED DESCRIPTION

A slotted lug for an electrical interconnect includes a receiving end for connecting to a flat electrical conductor and a fastening end for connecting to a surface mount terminal extending from the surface of a circuit. The circuit may be an integrated metal substrate (IMS) circuit board or a circuit card assembly (CCA), or more generally any surface mount circuit board. The angle between the receiving end and the fastening end may be between −100° to 100°. Typically, the angle may be 0° to 90°. The receiving end may include features such as wings and notches to facilitate crimping the receiving end to secure the connection with the flat electrical conductor. Alternatively, the receiving end and flat electrical conductor may be soldered together. The receiving end may also be both crimped and soldered to the flat electrical conductor. The fastening end may include at least two tabs separated by a slot that extends through the depth of the slotted lug. Each tab may further include a through hole for receiving a fastener, such as a screw, which in turn secure each tab to the surface mount terminal.

Figure 1A:
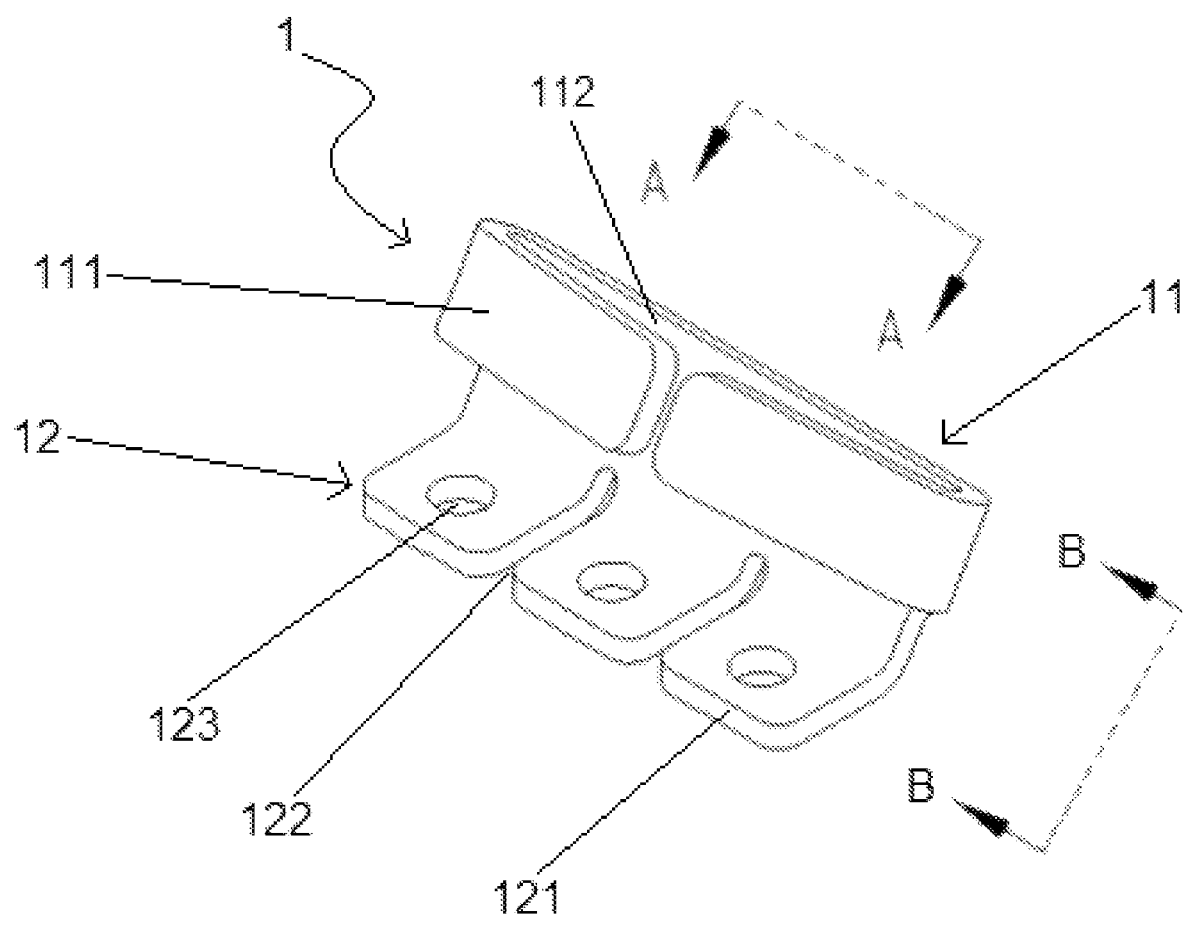
FIG. 1A is an oblique view of a slotted lug according to an embodiment.

FIG. 1A shows an exemplary slotted lug 1 that includes a receiving end 11 and a fastening end 12. The receiving end 11 may include wings 111 extending and bent inwards from the base 112 as shown in FIG. 1C. A flat electrical conductor 4 (shown in FIGS. 3-4) can be inserted between the wings 111 and the base 112. The flat electrical conductor 4 may then be crimped between the wings 111 and base 112, soldered in place, or both.

Figure 2A:
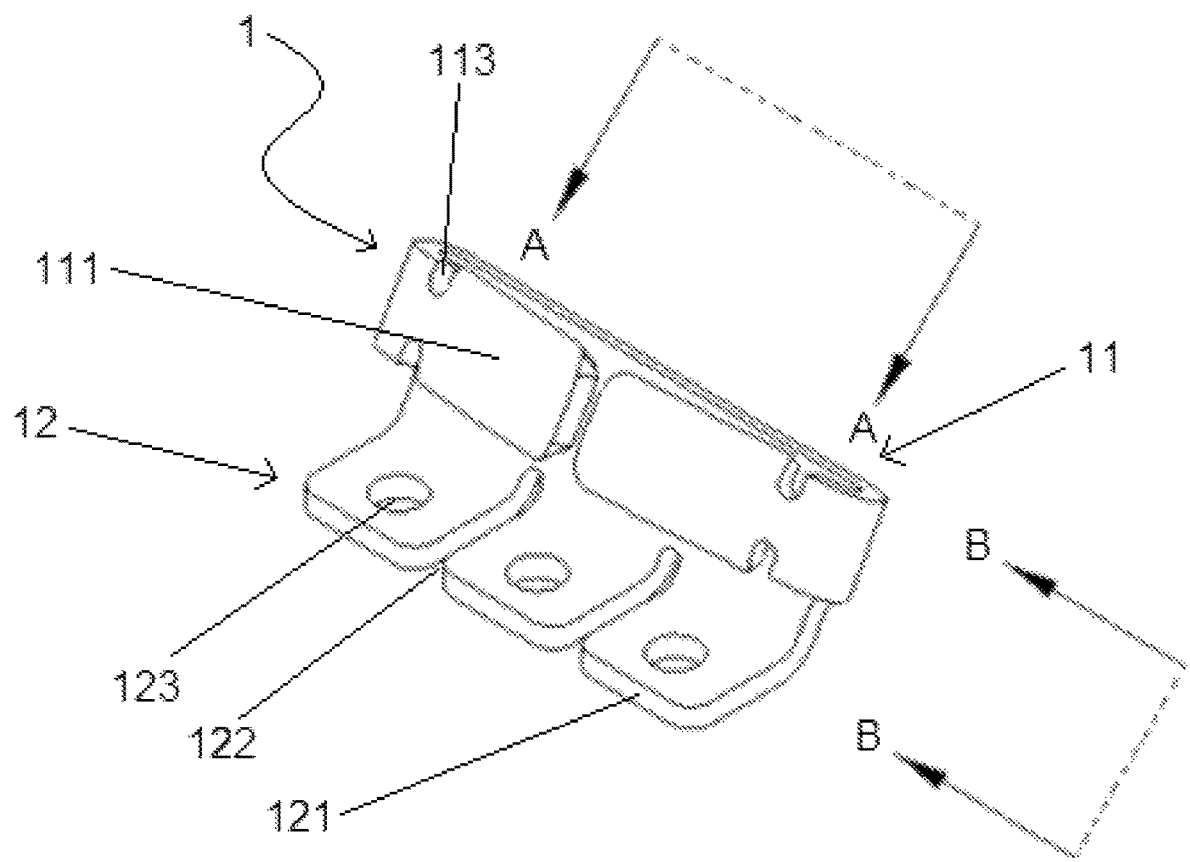
FIG. 2A is an oblique view of a slotted lug according to another embodiment.

FIG. 2A depicts an alternative embodiment where the wings may include notches 113. The notches 113 allow small bends in the wings 111 that may improve crimping the flat electrical conductor in place. Forming the wings 111 and base 112 may be used in the alternative to notches to aid with crimping.

Figure 1B:
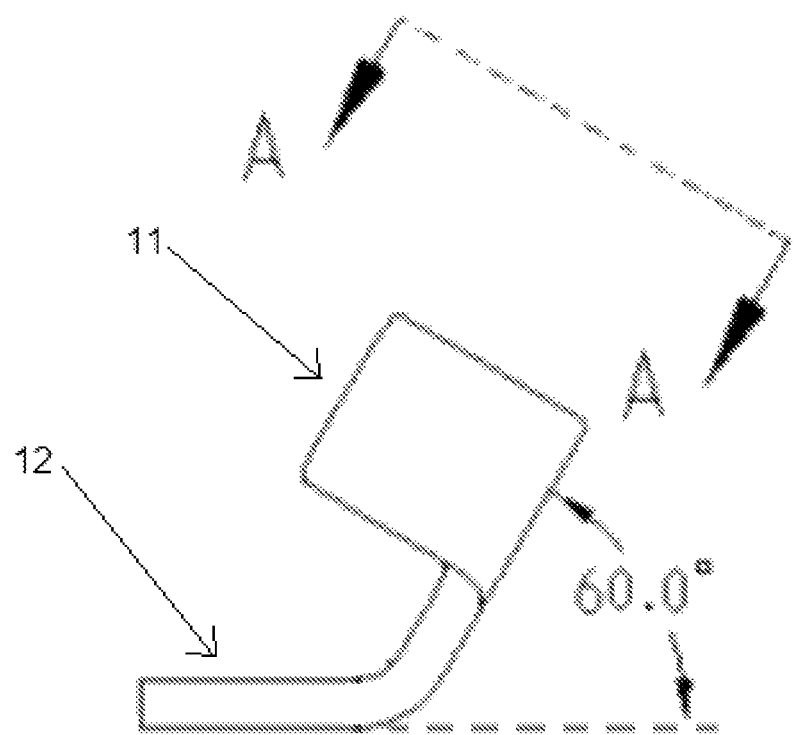
FIG. 1B is a view of the slotted lug of FIG. 1A along sight lines B-B.
Figure 1C:
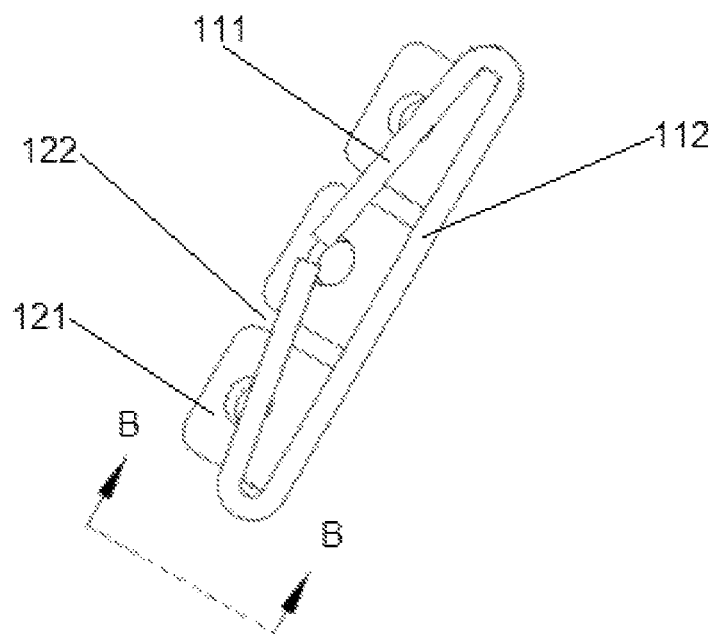
FIG. 1C is a view of the slotted lug of FIG. 1A along sight lines A-A.
Figure 2B:
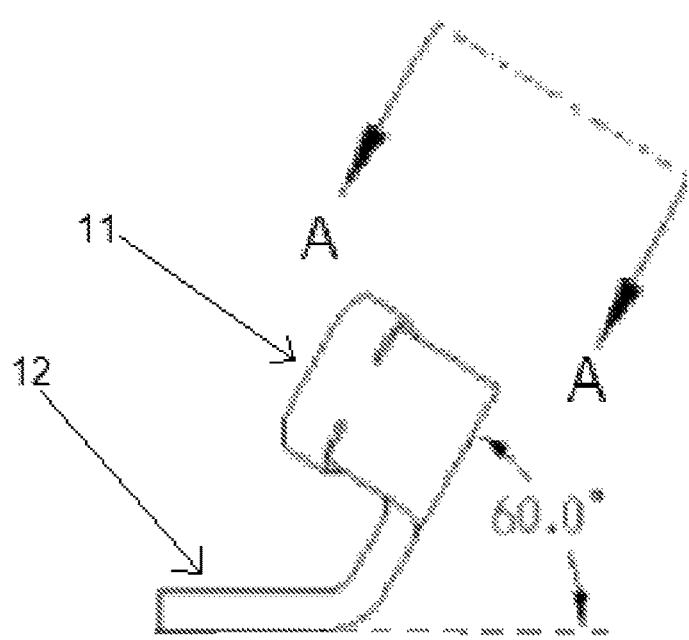
FIG. 2B is a view of the slotted lug of FIG. 2A along sight lines B-B.
Figure 2C:
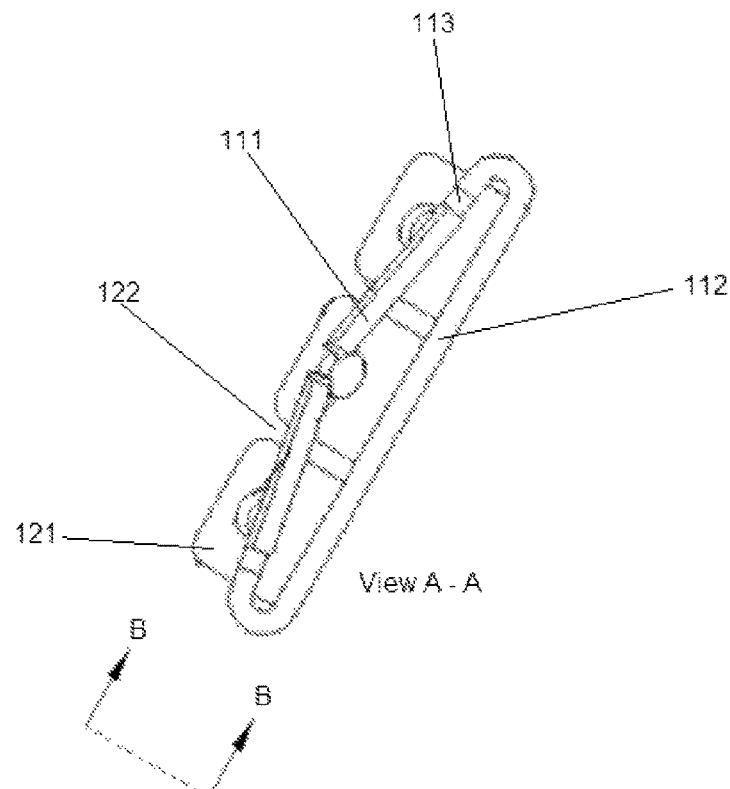
FIG. 2C is a view of the slotted lug of FIG. 2A along sight lines A-A.

The receiving end may also be bent at a non-zero angle relative to the plane of the fastening end as shown in FIGS. 1B and 2B. The angle may range between −100° to 100°. In an exemplary embodiment the angle between the receiving end and the fastening end may be 60°. This configuration may prevent the slotted lug 1 and flat electrical conductor 4 from contacting adjacent components. This in turn prevents short circuiting and other potential damaging or harmful situations. Additionally, this angled configuration may make it easier to insert the flat electrical conductor 4 and secure the connection by crimping and/or soldering.

Also shown in FIG. 1A are tabs 121 that make up the fastening end 12. Each tab 121 is separated from an adjacent tab 121 by a slot 122 and includes a through hole 123. This configuration allows each tab 121 to be connected to a circuit terminal with a fastener, such as a screw. Individually tightening each screw allows any gaps between the tab 121 and the surface mount terminal to be minimized, if not eliminated, thus reducing electrical resistance caused by areas of non-contact. In other words, the individual tabs 121 and fasteners may maximize the contact area between the tabs 121 and the surface mount terminal to which they are connected. This arrangement may also promote better thermal distribution between the components.

Figure 3A:
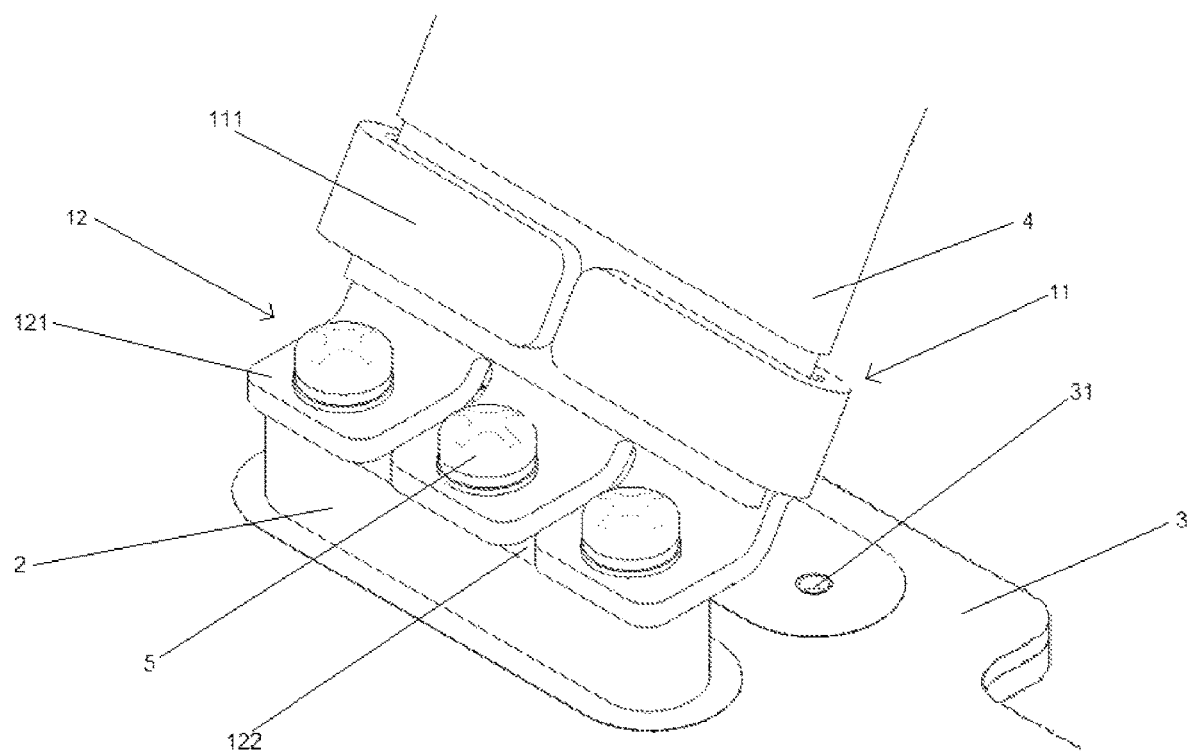
FIG. 3A is an oblique view of an assembled electrical interconnect.

FIG. 3A depicts an assembled electrical interconnect on a circuit 3. As discussed above, a flat electrical conductor 4 may be inserted into the receiving end 11 of the slotted lug 1. The flat electrical conductor 4 may be secured to the slotted lug 1 by crimping the wings 111, soldering, or both. The flat electrical conductor may be capable of transmitting current of at least 100 Arms and be selected from a flat metal wire, a foil, a rectangular Litz wire, and other suitable conductors known in the art. It will be appreciated that the transmitting current of at least 100 Arms is a non-limiting value, and that other suitable currents, such as those under 100 Arms, may be transmitted through slotted lugs as described herein. The foil may be made of a single flat sheet, several stacked layers, or a folded sheet. Since the receiving end 11 is formed at a non-zero angle relative to the fastening end 12 contact between the flat electrical conductor 4 and adjacent component may be avoided in order to prevent short circuits and other dangerous conditions.

Figure 3B:
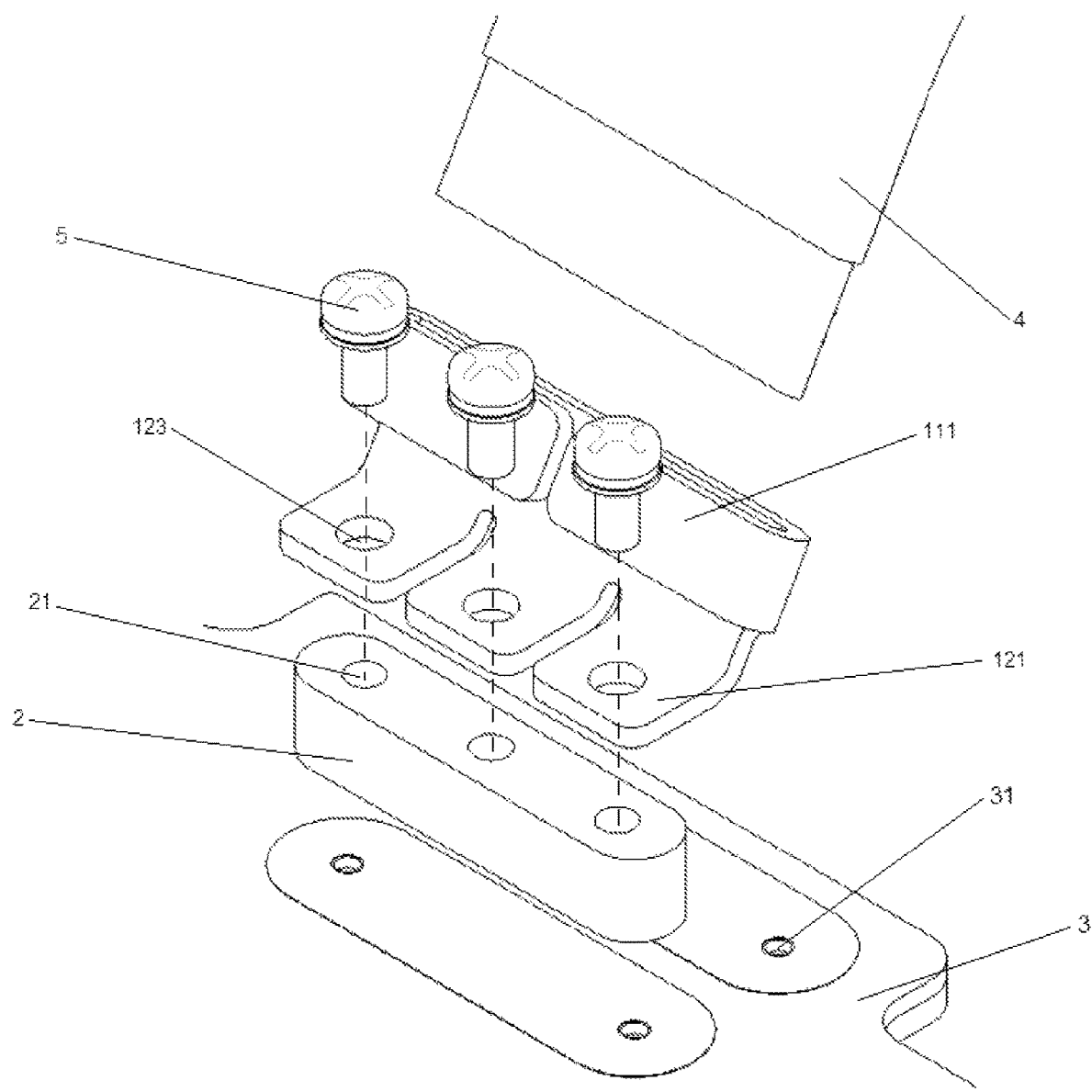
FIG. 3B is an exploded oblique view of the electrical interconnect shown in FIG. 3A.

The fastening end 12 may be secured to the surface mount terminal 2 by fasteners 5, such as screws. As shown in FIG. 3B, the fasteners 5 pass through the through holes 123 of each tab 121. The fasteners 5 are held within the tapped holes 21. Any gaps between an individual tab 121 and the surface mount terminal 2 may be minimized, if not eliminated, by adjusting the corresponding fastener 5. By maximizing the surface contact between each tab 121 and the surface mount terminal 2 minimal current distortion and lowered resistance may result.

Figure 4:
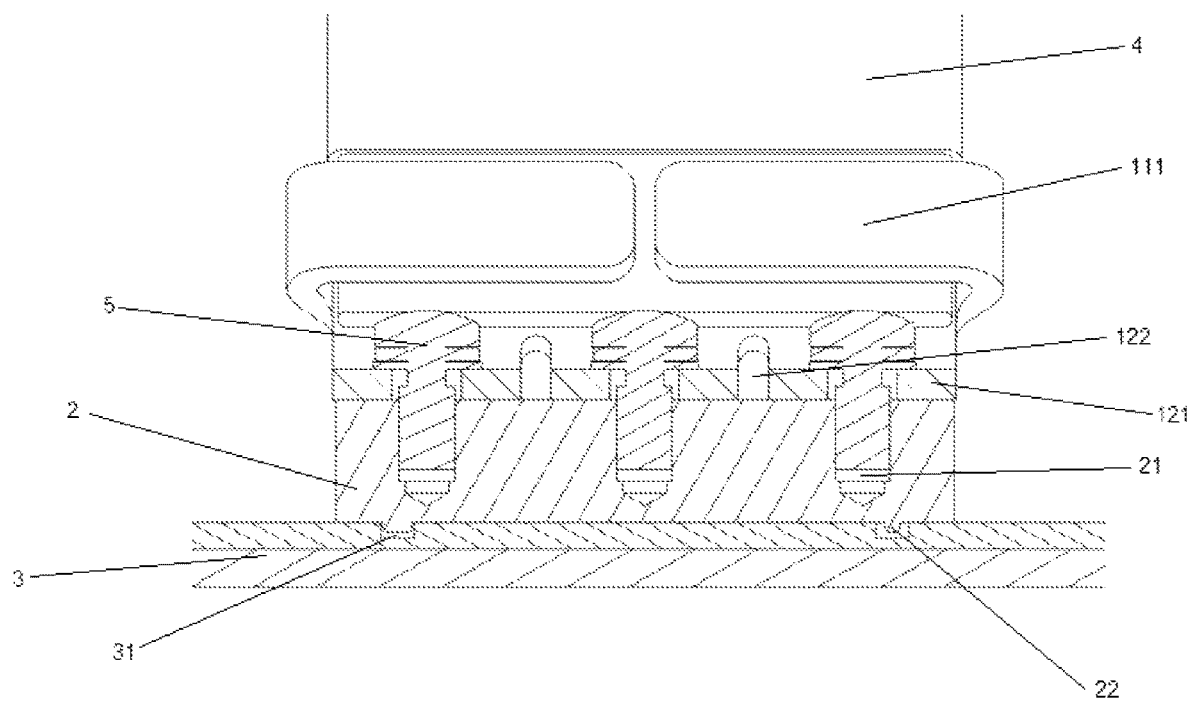
FIG. 4 is a cut-away side view of an assembled electrical interconnect.

The surface mount terminal 2 may include tapped holes 21, each corresponding to a through hole 123 of the slotted lug 1. As discussed above, the tapped holes accept the fasteners 5 that secure the slotted lug 1 to the surface mount terminal 2. The surface mount terminal may further include alignment posts 22 extending from the surface that contacts the circuit 3. Each alignment post may be inserted into a corresponding receptacle 31 on the circuit 3 to ensure that the surface mount terminal 2 is properly positioned as shown in FIG. 4. Once the surface mount terminal is correctly positioned on the circuit it may be secured in place by soldering. Blind holes that correspond to the tapped holes 21 may be included to prevent solder intrusion into the tapped holes 21 when soldering the surface mount terminal 2 to the circuit 3. The alignment posts 22 can additionally provide an anti-torque function by resisting rotational movement transferred from the fasteners 5 when they are put into place and tightened.

The slotted lug 1 and surface mount terminal 2 may be constructed from copper, silver, gold, and alloys thereof. Copper and copper alloys are preferred for their excellent conductive properties and cost effectiveness. The number of tabs 121 on the slotted lug 1 may be decreased or increased according to the width of the flat electrical conductor 4. One tab 121 may be suitable for small, i.e. 0.25 inches wide, flat electrical conductors 4. For applications with larger flat electrical conductors 4 a tab 121 may be provided for approximately every 0.375 inches of width of the flat electrical conductor 4.

Figure 5:
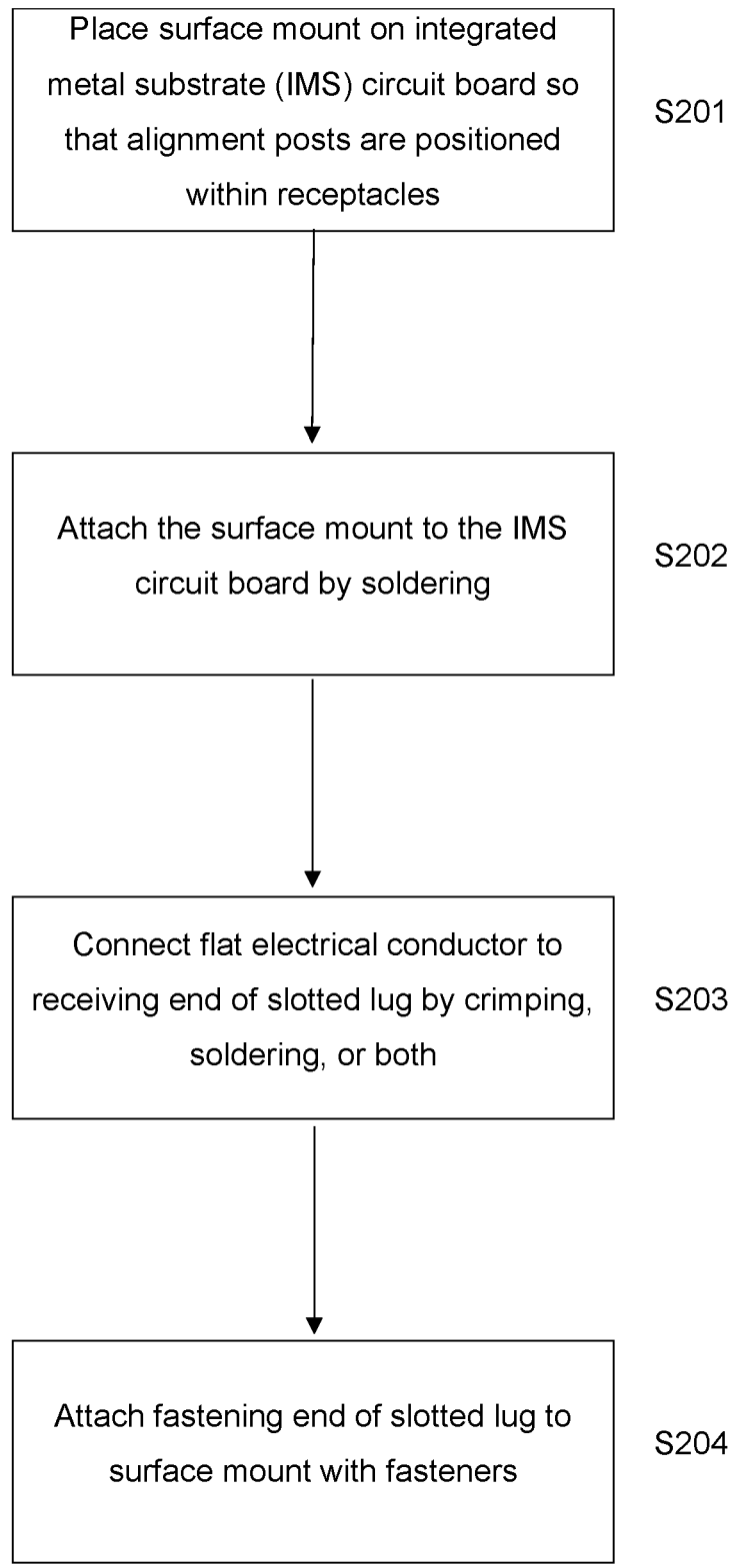
FIG. 5 is a flow chart describing a method by which the interconnect system may be assembled.

The interconnect system may be assembled as follows and depicted in FIG. 5. The surface mount terminal 2 (FIG. 3A) may be placed on the circuit 3 (FIG. 3A) so that the alignment posts 22 (FIG. 4) are inserted into the receptacles

31 (FIG. 4), in step S201. The surface mount terminal 2 may then be soldered to the circuit 3, in step S202. This step may be followed by step S203, where a flat electrical conductor 4 (FIG. 3A) may be inserted into the receiving end 11 (FIG. 2A) of the slotted lug 1 and be secured by crimping the wings 111 (FIG. 1A) against the base 112 (FIG. 1A), or by soldering (or both). Next, fasteners may be used to attach the fastening end 12 (FIG. 1A) of the slotted lug 1 (FIG. 1A) to the surface mount terminal 2 in step S204. One having ordinary skill in the art will appreciate that the order of steps may be varied according to manufacturing needs or other requirements.

Although the disclosure has been shown and described with respect to a certain embodiment or embodiments, equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the disclosure. In addition, while a particular feature of the disclosure may have been described above with respect to only one or more of several illustrated embodiments, such feature may be combined with one or more other features of the other embodiments, as may be desired and advantageous for any given or particular application.

What is claimed is:

1. A slotted lug, comprising:
   a receiving end configured to be connected to an electrical conductor; and
   a fastening end configured to receive an end portion of the electrical conductor;
   wherein the fastening end comprises multiple tabs, each tab separated from an adjacent tab by a slot extending through a depth of the fastening end, each tab including a through hole extending in a depth direction; and
   wherein an angle formed between the receiving end and the fastening end is −100° to 100°.

2. The slotted lug of claim 1, wherein:
   the receiving end is configured to be connected to a flat electrical conductor; and
   the fastening end is configured to receive an end portion of the flat electrical conductor.

3. The slotted lug of claim 2, wherein a connection between the receiving end and the flat electrical conductor is selected from at least one of crimping and soldering.

4. The slotted lug of claim 2, wherein the receiving end includes wings configured to be folded inward from a back to secure the flat electrical conductor therebetween.

5. The slotted lug of claim 1, wherein the angle formed between the receiving end and the fastening end is greater than 0° and less than or equal to 90°.

6. An electrical interconnect, comprising:
   a circuit;
   a surface mount terminal extending from a surface of the circuit; and
   a slotted lug that includes:
   a receiving end configured to be connected to an electrical conductor; and
   a fastening end configured to receive an end portion of the electrical conductor;
   wherein the fastening end includes multiple tabs, each tab separated from an adjacent tab by a slot extending through a depth of the fastening end, each tab including a through hole extending in a depth direction; and
   wherein an angle formed between the receiving end and the fastening end is −100° to 100°.

7. The electrical interconnect of claim 6, wherein:
   the surface mount terminal further comprises two or more alignment posts protruding from a surface that contacts the circuit; and
   the circuit further comprises receptacles configured to receive the alignment posts.

8. The electrical interconnect of claim 6, wherein the surface mount terminal is soldered to the circuit.

9. The electrical interconnect of claim 6, wherein:
   the receiving end is configured to be connected to a flat electrical conductor; and
   the fastening end is configured to receive an end portion of the flat electrical conductor.

10. The electrical interconnect of claim 9, wherein the flat electrical conductor is selected from a flat wire, a foil, and a rectangular Litz wire.

11. The electrical interconnect of claim 9, wherein a connection between the receiving end and the flat electrical conductor is selected from at least one of crimping and soldering.

12. The electrical interconnect of claim 9, wherein the receiving end further comprises wings that are configured to be folded inward from a back to secure the flat electrical conductor therebetween.

13. The electrical interconnect of claim 6, wherein the circuit is selected from one of a circuit board and a circuit card assembly.

14. An electrical interconnect, comprising:
   a circuit;
   a surface mount terminal extending from a surface of the circuit; and
   a slotted lug that includes:
   a receiving end; and
   a fastening end;
   wherein the fastening end includes multiple tabs, each tab separated from an adjacent tab by a slot extending through a depth of the fastening end, each tab including a through hole extending in a depth direction;
   wherein an angle formed between the receiving end and the fastening end is −100° to 100°; and
   wherein the surface mount terminal includes a plurality of tapped holes therein, each of the plurality of tapped holes corresponding to one of the through holes on the slotted lug.

15. The electrical interconnect of claim 14, wherein each tab is secured to the surface mount terminal with a fastener that passes through the through hole and into the corresponding tapped hole.

16. A method of establishing an electrical connection, comprising:
   attaching a surface mount terminal comprising alignment posts onto a circuit;
   connecting a flat electrical conductor to a slotted lug, wherein the slotted lug comprises:
   a receiving end configured to be connected to the flat electrical conductor; and
   a fastening end configured to receive an end portion of the flat electrical conductor;

wherein the fastening end comprises multiple tabs, each tab separated from an adjacent tab by a slot extending through a depth of the fastening end, each tab including a through hole extending in a depth direction; and wherein an angle formed between the receiving end and the fastening end is −100° to 100°; and attaching the slotted lug to the surface mount terminal.

17. The method of claim 16, wherein:

attaching the surface mount terminal to the circuit includes soldering; and the circuit is selected from one of a circuit board and a circuit card assembly.

18. The method of claim 16, wherein connecting the flat electrical conductor to the receiving end is selected from at least one of crimping and soldering.

19. The method of claim 16, wherein attaching the slotted lug to the surface mount terminal includes securing the slotted lug to the surface mount terminal with fasteners.

20. The method of claim 16, wherein:

the circuit comprises receptacles; and attaching the surface mount terminal to the circuit includes inserting the alignment posts into the receptacles.

\* \* \* \* \*